(12) United States Patent
Hubner et al.

(10) Patent No.: US 10,917,000 B2
(45) Date of Patent: Feb. 9, 2021

(54) DRIVER UNIT, ELECTRIC POWER CONVERTER, VEHICLE AND METHOD FOR OPERATING AN ELECTRIC POWER CONVERTER

(71) Applicant: VALEO SIEMENS EAUTOMOTIVE GERMANY GMBH, Erlangen (DE)

(72) Inventors: Philip Hubner, Erlangen (DE); Alexander Bucher, Nuremberg (DE)

(73) Assignee: VALEO SIEMENS EAUTOMOTIVE GERMANY GMBH, Erlangen (DE)

(*) Notice: Subject to any disclaimer, the term of this patent is extended or adjusted under 35 U.S.C. 154(b) by 0 days.

(21) Appl. No.: 16/217,849

(22) Filed: Dec. 12, 2018

(65) Prior Publication Data
US 2019/0199192 A1    Jun. 27, 2019

(30) Foreign Application Priority Data

Dec. 22, 2017   (EP) .................................... 17210343

(51) Int. Cl.
*H02P 27/08*   (2006.01)
*H02M 1/08*   (2006.01)
(Continued)

(52) U.S. Cl.
CPC .................. *H02M 1/08* (2013.01); *B60L 1/00* (2013.01); *B60L 50/51* (2019.02); *B60L 53/22* (2019.02); *H02J 7/022* (2013.01); *H02M 3/33569* (2013.01); *H02M 7/5395* (2013.01); *H02P 27/08* (2013.01); *H03K 17/162* (2013.01);
(Continued)

(58) Field of Classification Search
CPC . H02M 3/3374; H02M 3/33561; B60L 53/20; B60L 2200/26; Y02T 90/127; Y02T 90/14
See application file for complete search history.

(56) References Cited

U.S. PATENT DOCUMENTS 5,677,604 A * 10/1997 Masaki .................... H02J 7/022
                                                          318/139
2012/0063187 A1* 3/2012 Sato ..................... H02M 3/3374
                                                          363/131

(Continued)

OTHER PUBLICATIONS

European Search Report of European Application No. 17210343.4 dated May 23, 2018.

(Continued)

*Primary Examiner* — Rina I Duda
(74) *Attorney, Agent, or Firm* — Manabu Kanesaka (57) ABSTRACT

Driver unit for a voltage-controlled switching element, includes a first output terminal for connecting a control terminal of the switching element, a second output terminal for connecting a further terminal of the switching element, an output stage section having a high-side terminal and a low-side terminal and being controllable to connect one of its terminals to the first output terminal of the driver unit based on a control signal representative switching the switching element, and a DC conversion section configured to supply the output stage section and to convert an input voltage into a positive first voltage between the high-side terminal and the second output terminal of the driver unit and into a positive second voltage between the second output terminal of the driver unit and the low-side terminal.

15 Claims, 6 Drawing Sheets

(51) Int. Cl.
    *H03K 17/16*     (2006.01)
    *B60L 53/22*     (2019.01)
    *B60L 50/51*     (2019.01)
    *B60L 1/00*     (2006.01)
    *H02J 7/02*     (2016.01)
    *H02M 3/335*     (2006.01)
    *H02M 7/5395*     (2006.01)

(52) U.S. Cl.
    CPC ....... *B60L 2210/12* (2013.01); *B60L 2210/14* (2013.01); *B60L 2210/40* (2013.01)

(56) References Cited

U.S. PATENT DOCUMENTS

2014/0225433 A1*   8/2014   Niizuma .................. B60L 7/14
                                                         307/10.1
2015/0274026 A1*  10/2015   Rippel ................... H02J 7/045
                                                         318/139
2016/0329823 A1*  11/2016   Nakamura ........ H02M 3/33561

OTHER PUBLICATIONS

Bayerer R: "Anwendung, Ansteuerung Und Kurzschlussschutz Von IGBT", Elektrotechnische Zeitschrift—ETZ, VDE Verlag GmbH, Berlin, DE, vol. 110, No. 10, May 1, 1989; pp. 472-474; ISSN: 0948-7387.

Biswas S K et al; "Gate Drive Method for IGBTS in Bridge Configuurations" Conference Record of the Industry Applications Conference Denver, Oct. 2 to 5, 1994; vol. 2, Oct. 2, 1994, pp. 1310-1316; ISBN? 978-0-7803-1994-3.

* cited by examiner

DRIVER UNIT, ELECTRIC POWER CONVERTER, VEHICLE AND METHOD FOR OPERATING AN ELECTRIC POWER CONVERTER

RELATED APPLICATIONS

The present application is based on, and claims priority from, European Application No. 17 210 343.4 filed Dec. 22, 2017, the disclosure of which is hereby incorporated by reference herein in its entirety.

The present invention relates to a driver unit for a voltage-controlled switching element, comprising a first output terminal for connecting a control terminal of the switching element, a second output terminal for connecting a further terminal of the switching element, an output stage section having a high-side terminal and a low-side terminal and being controllable to connect one of its terminals to the first output terminal based on a control signal representative switching the switching element, and a DC conversion section configured to supply the output stage section and to convert an input voltage into a positive first voltage between the high-side terminal and the second output terminal of the driver unit and into a positive second voltage between the second output terminal of the driver unit and the low-side terminal, Aside, the invention relates to an electric power converter, a vehicle and a method for operating an electric power converter.

Driver units are widely known for providing a suitable power for charging and discharging a control terminal of a voltage-controlled switching element of an electric power converter based on a control signal, typically obtained from a control unit of the electric power converter. The driver unit comprises a first output terminal for connecting a control terminal of the switching element, such as a gate terminal, and a second output terminal for connecting a further terminal of the switching element, such as an emitter or a source terminal. Depending on the state of the control signal an output stage section connects its high-side terminal to the first output terminal for switching on the switching element or its low-side terminal to the first output terminal for switching off the switching element. A DC conversion section provides a positive first voltage between the high-side terminal and the second output terminal and a positive voltage between the second output terminal and the low-side terminal. Thus, between the first output terminal and the second output terminal a positive voltage drops, when the switching element is switched on, and a negative voltage drops, when the switching element is switched off.

When switching off an ohmic-inductive load by the switching element, high transient voltages (du/dt) and currents (di/dt) occur that might damage the switching element. Particularly, the transient voltages can exceed a maximum rated voltage of the switching element due to parasitic of a commutation cell. The overshoot of the transient voltages can be influenced by a switching speed of the switching element. Therein, a slow switching off speed results in low transient voltages at the cost of high switching losses. Contrarily, a fast switching off speed causes high transient voltages but only low switching losses. Thus, it is desired to operate the switching element with an optimum switching off speed, which depends especially on an actual temperature of the switching element, a voltage to be switched, such as a voltage provided by a high-voltage battery of a vehicle, and an actual current of the ohmic-inductive.

It has already been proposed to use an output stage section with two resistors connected controllably in parallel, through which a current flows from the first output terminal to the low-side terminal, when switching off the switching element. Therein, the current flows through one resistor for a slow switching off speed and through both resistors for a fast switching off speed. The resistors are controlled to be connected in parallel, if an additional control information representative for the switching off speed is received from the control unit.

However, such a multiple resistor configuration allows only an inaccurate, stepwise adjustment of the switching off speed. Furthermore, large mounting space and additional components are required, particularly when more than two switching off speeds have to be realized by means of a corresponding number of resistors. Furthermore, the control information has to be transmitted to the output stage section, which requires additional wiring effort. Particularly, if the control unit has to be decoupled galvanically from the output stage section, the control information has to be transmitted over an insulation barrier by means of an insulation element, such as an optocoupler.

Thus, it is an object of the invention to provide an improved driver unit, particularly allowing an accurate variation of the switching off speed and requiring less mounting space and less wiring and/or insulation effort.

The above object is solved by a driver unit as initially described, wherein the DC conversion section is configured to provide the first voltage and the second voltage such that, when a value of the first voltage is above a threshold value, a value of the second voltage increases more than the first voltage with an increase of the input voltage.

The invention is based on the consideration to vary a switching off speed of the switching element by varying the second voltage provided between the second output terminal and the low-side terminal. Thus, if the second voltage increases, the absolute value of a negative voltage dropping between the first output terminal and the second output terminal of the driver unit increases as well. When switching off the switching element, a higher second voltage results in a higher discharge current of a capacity of the control terminal of the switching element and, consequently, in a faster switching off speed an in a faster id/dt. The variation of the second voltage and thus the variation of the switching off speed can be specified by a corresponding variation of the input voltage of the DC conversion section, when the first voltage is above the threshold value, which is a desired operation condition of the driver unit.

Advantageously, the switching off speed can be varied independently of, i.e. instead of or additionally to, a variation of a resistance between the first output terminal of the driver unit and the low-side terminal of the output stage section. Therein, the switching off speed can be varied as accurate as the input voltage of the DC conversion section is variable. Furthermore, a transmission of a control information representative of the switching off speed to the output state section can be omitted. Consequently, less wiring effort is required.

Typically, the switching element is a semiconductor switching element. The voltage-controlled switching element may comprise a power transistor, such as an insulated gate field-effect transistor or an insulated gate bipolar transistor. The switching element may further comprise a diode connected in parallel to the transistor. In the case of the transistor being an insulated gate field-effect transistor, the diode may be formed by a body diode of the transistor. The output stage section may have an output terminal connected to the first output terminal of the driver unit. The output stage section may have a resistor, which defines the switching on speed together with the first voltage, connected between the high-side terminal and the output terminal of the output stage section.

The DC conversion section may have a first output terminal connected to the high-side terminal and/or a second output terminal connected to the low-side terminal and/or a third output terminal connected to the second output terminal, Typically, the first voltage drops between the first output terminal of the output stage section and the third output terminal of the output stage section and/or the second voltage drops between the third output terminal of the output stage section and the second output terminal of the output stage section. The output stage section may be configured such that the input voltage drops between its first output terminal and its second output terminal. Preferably, the DC conversion section is configured to provide the first voltage with a value between 10 V and 30 V and/or the second voltage with a value between 0 V and 20 V. The DC conversion section may comprise a buffer capacitor connected between its first output terminal and its third output terminal and/or a buffer capacitor connected between its second output terminal and its third output terminal.

In general, it is possible that the DC conversion section is configured to provide the first voltage such that the first voltage increases slightly with an increase of the input voltage when being above the threshold value. However, it is preferred that the threshold value is a value, to which the first voltage is limited by the DC conversion section. This is because overvoltages typically do not occur when switching on the switching element, so that a variation of the switching on speed by means of varying the first voltage is not necessary. Furthermore, during an on-state of the switching element a constant control voltage is desirable in order to obtain steady conduction losses. Thus, the first voltage may be, particularly substantially, constant above the threshold value. The DC conversion section may be configured to convert the input voltage having a value below the threshold value into the first voltage, wherein the second voltage is, particularly substantially, zero. Alternatively or additionally, the DC conversion section may be configured to convert the input voltage having a value above the threshold value into the first voltage having a value corresponding to the threshold value and/or into the second voltage being the difference between the input voltage and the first voltage.

Desirably, the DC conversion section comprises a push-pull-subsection having a central tap connected to the second output terminal of the driver unit. Thereby, it is assured that the central tap and the further terminal of the switching element are on the same potential. Typically, the push-pull-section comprises two transistors, particularly transistors of different types, such as an npn-transistor and a pnp-transistor or an n-channel transistor and a p-channel transistor, connected in series between both potentials of the input voltage.

Furthermore, the DC conversion section may comprise a reference value subsection configured to define the threshold value and connected between a positive potential of the input voltage and a control terminal of the push-pull-subsection. The reference value subsection may comprise a Zener diode connected between the positive potential and the control terminal, which is preferably a common node of control terminals of the transistors of the push-pull-subsection. The Zener diode may be connected in series to a resistor. The resistor may be connected to the negative potential of the input voltage and the control terminal. Thus, the threshold value may be defined easily by the Zener voltage of the Zener diode.

Preferably, the output stage section comprises a push-pull-subsection having a central tap connected to the first output terminal of the driver unit and/or having a control terminal for obtaining the control signal, Therein, when the control signal is indicative for switching on the switching element, the high-side terminal may be connected to the first output terminal of the driver unit by the push-pull-subsection of the output stage section and, when the control signal is indicative for switching off the switching element, the low-side terminal may be connected to the first output terminal of the driver unit by the push-pull-subsection of the output stage section. Typically, the push-pull-section comprises two transistors, particularly transistors of different types, such as an npn-transistor and a pnp-transistor or an n-channel transistor and a p-channel transistor, connected in series.

In general, the output stage section may comprise a resistor being interconnected between the first output terminal of the driver unit or the output terminal of the output stage section, respectively, and the low-side terminal. Additionally or alternatively, the output stage section may comprise an active subsection interconnected between the first output terminal of the driver unit and the low-side terminal and configured to sink a current flowing to the low-side terminal increasing corresponding to an increase of the second voltage. Thereby, the switching off speed may be increased in comparison to the usage of only the resistor between the output terminal of the output stage section and the low-side terminal. Note that the current sunk by the active subsection depends on the variation of the input voltage, so that for the variation of the current a transmission of the control information representative for the switching off speed to the output stage section is avoided.

The active subsection may comprise a reference value element and an amplifier circuit, wherein the amplifier circuit is configured to sink the current, when the value of second voltage exceeds a reference voltage provided by the reference value element. Typically, the reference value element is connected between the second output terminal of the driver unit and the low-side terminal. The reference value element may comprise a Zener diode and a resistor connected in series, wherein a central tap therebetween is connected to an input of the amplifier circuit. The amplifier circuit may comprise a transistor or an operational amplifier. Note that the amplifier circuit may be operated in a switching operation range or in an active operation range. Thus, the amplifier circuit being operated in the switching operation range may connect a resistor of the amplifier circuit in parallel to the resistor that is connected between the output terminal of the output stage section and the low-side terminal.

For safety reasons it is preferred that the driver unit is divided into a primary side and a secondary side being decoupled galvanically from each other, wherein the DC conversion section and/or the output stage section and/or the output terminals of the driver unit are part of the secondary side and a first input terminal of the driver unit for providing a supply voltage for the driver unit and/or a second input terminal of the driver unit for obtaining the control signal and/or a third input terminal of the driver unit for obtaining a control information representative for a switching off speed of the switching element are part of the primary side. The second input terminal of the driver unit may be decoupled galvanically by means of an insulation element, particularly an optocoupler, an inductive insulation element or a capacitive insulation element, forming an interface between the primary side and the secondary side.

Advantageously, the driver unit comprises a second DC conversion section configured to convert an input voltage into an output voltage provided to the first DC conversion section as its input voltage. Thus, the second DC conversion section may be used to provide the input voltage of the first DC conversion section with a desired value corresponding to the switching off speed as the input of the first DC conversion section. Typically, the input voltage of the second DC conversion section is obtained from the first input terminal of the driver unit. If the second DC conversion section is omitted, the input voltage of the first DC conversion section is obtained from the first input terminal of the driver unit. Moreover, the first input terminal of the driver unit on the one hand and the first DC conversion section, the output stage section and the output terminals of the driver unit on the other hand may be galvanically decoupled by the second DC conversion section.

Preferably, the second DC conversion section comprises a resonant converter, particularly an LLC-converter. The second DC conversion section may comprise a transformer subsection, which decouples galvanically the first input terminal of the driver unit on the one hand and the first DC conversion section, the output stage section and the output terminals on the other hand. Particularly, on the primary side of the transformer subsection the resonant converter comprises a switching section and/or a resonant circuit subsection. On the secondary side of the transformer subsection the resonant converter may comprise a rectifier subsection configured to rectify a voltage transformed by the transformer subsection and preferably a smoothing capacitor subsection configured to smooth the rectified voltage.

As a first alternative, the driver unit may be configured to control a switching subsection of the resonant converter with a switching frequency within an interval enclosing a resonance frequency of the resonant converter. This allows the input voltage to be transferred substantially independently of the load of the second DC conversion section. Typically, the interval is limited by 0.9 times the resonance frequency and by 1.1 times the resonance frequency.

As a second alternative, the driver unit may be configured to control a switching subsection of the resonant converter with a switching frequency being below a resonance frequency of the resonant converter based on the control information representative for a switching off speed of the switching element. Thereby, the voltage conversion ratio and the switching off speed is varied corresponding to the switching frequency being in a load-dependent operating range of the resonant converter. Therein, the switching frequency may be determined based on a desired output voltage of the second DC conversion section.

With respect to both alternatives, the switching subsection may comprise a plurality of switches being arranged in a half bridge or in a full bridge.

Aside, the present invention refers to an electric power converter, comprising a driver unit according to the invention. The electric power converter is preferably an inverter. Alternatively, the electric power converter may be a DC/DC converter, particularly comprising a boost converter, a buck converter, a combined boost-buck-converter, a flyback converter, a phase-shifted full-bridge, a capacitive half bridge or another hard-switched half bridge. Furthermore, the electric power converter may be a, particularly controlled, AC/DC converter.

The electric power converter may comprise a control unit configured to provide the control signal and/or the control information. Preferably, the control unit is configured to determine the switching frequency and to provide it by means of the control information to the driver unit.

Moreover, the present invention refers to a vehicle comprising at least one electric power converter according to the invention. Therein, one electric power converter is configured to supply an electric machine of the vehicle and/or one electric power converter is a DC/DC converter in a wiring system of the vehicle and/or one electric power converter is an AC/DC converter being configured as an onboard charger for a high-voltage battery of the vehicle.

Finally, the present invention refers to a method for operating an electric power converter having a voltage-controlled switching element and a driver unit, wherein the driver unit comprises a first output terminal connected to a control terminal of the switching element, a second output terminal connected to a further terminal of the switching element, an output stage section having a high-side terminal and a low-side terminal and being controlled to connect one of its terminals to the first output terminal of the driver unit based on a control signal representative switching the switching element, and a DC conversion section, wherein the DC conversion section supplies the output stage section and converts an input voltage into a positive first voltage between the high-side terminal and the second output terminal of the driver unit and into a positive second voltage between the second output terminal of the driver unit and the low-side terminal, wherein the DC conversion section provides the first voltage and the second voltage such that, when a value of the first voltage is above a threshold value, a value of the second voltage increases more than the first voltage with an increase of the input voltage.

All statements referring to the inventive driver unit apply analogously to the inventive electric power converter, the inventive vehicle and the inventive method, so that the above-mentioned advantages of the inventive driver unit may be achieved as well.

Further details and advantages of the invention are disclosed in the following, wherein reference is made to the drawings showing.

Figure 1:
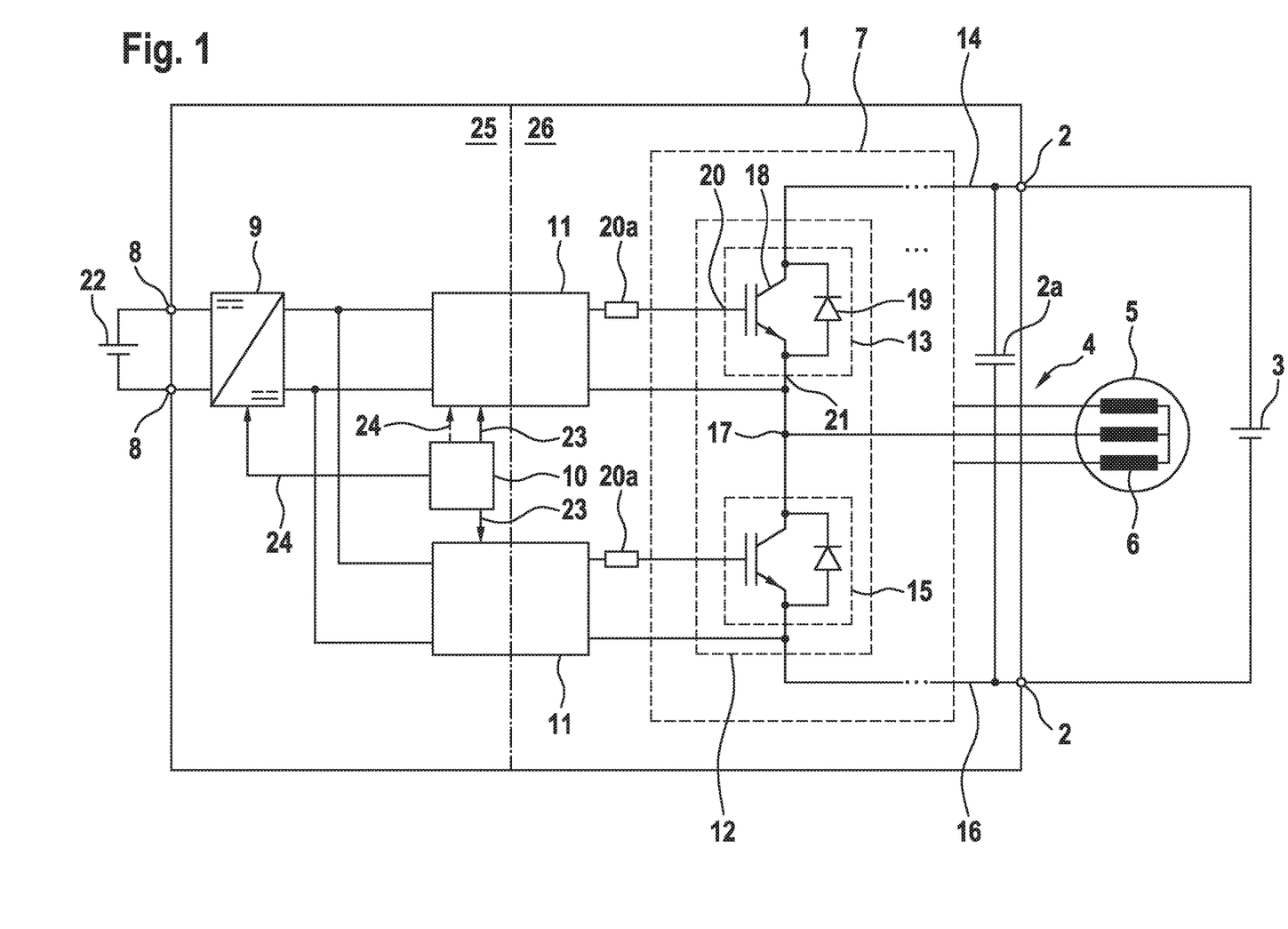
FIG. 1 is a block diagram of an embodiment of an electric power converter.

FIG. 1 is a block diagram of a first embodiment of an electric power converter 1, which is exemplarily depicted as an inverter. Thus, a DC link 2 with an DC link capacitor 2a of the electric power converter 1 is connected to a first DC voltage source 3, which is e.g. a high-voltage battery having a nominal voltage of e.g. 500 V. An AC output 4 of the electric power converter 1 is connected to electric machine 5, wherein the AC output 4 provides a multi-phase AC current to stator windings 6 of the electric machine 5.

Furthermore, the electric power converter 1 comprises a power unit 7 connected between the DC link 2 and the AC output 4, a low-voltage input 8, a DC conversion unit 9, a control unit 10 and driver units 11.

As the electric power converter 1 is an inverter, the power unit 7 comprises a plurality of half bridges 12 connected in parallel to each other and to a smoothing capacitor (not shown) of the DC link 2. For each phase of the AC output 4 one half bridge 12 is provided. Each half bridge 12 comprises a voltage-controlled switching element 13 connected to a high potential 14 of the DC link 2 and a voltage-controlled switching element 15 connected to a low potential 16 of the DC link 2. The switching elements 13, 15 are connected in series, wherein a central tap 17 is connected to one phase of the AC output 4.

Each switching element 13, 15 comprises a power transistor 18 being an insulated gate bipolar transistor and a diode 19 connected in parallel. Alternatively, the power transistor 18 is an insulated gate field-effect transistor, wherein the diode 19 may be formed by a body diode of the insulated gate field-effect transistor. Each switching element 13, 15 comprises a control terminal 20, which is formed by a gate terminal of the transistor 18, and a further terminal 21 connected to a switching path realized by the switching element 13, 15. With respect to the realization of the switching element 13, 15 by means of the power transistor 18 the further terminal 21 is formed by an emitter terminal or a source terminal, respectively.

The low-voltage input 8 is connected to a second DC source 22, which is e.g. a low-voltage battery having a nominal voltage of 12V. Via the low-voltage input 8 an operating voltage for the control unit 10 is provided, wherein a wiring therebetween is not shown in FIG. 1 for reasons of simplicity. Furthermore, the low-voltage input 8 is connected to the DC conversion unit 9, being e.g. a buck converter or a boost converter, configured to provide a supply voltage to the driver units 11.

The control unit 10 is configured to provide a control signal 23 representative for switching a respective switching element 13, 15. The control signal 23 represents a pulse-width-modulated switching pattern according to which a respective switching element 13, 15 of each half bridge 12 is switched on or off such that the multiphase AC current is provided at the AC output 4.

Furthermore, the control unit 10 is configured to provide a control information 24 representative for a desired switching off speed of the switching elements 13, 15. Therein, the control unit 10 is configured to determine the switching off speed based on an actual temperature of the switching elements 13, 15, an actual voltage obtained at the DC link 2, an actual load current at the AC output 4 and an actual temperature of a coolant cooling the switching elements 13, 15. The switching off speed is determined such that, when switching off the switching elements 13, 15, transient voltages (du/dt) and transient currents (di/dt), particularly caused by parasitic inductances when commutating, do not exceed maximum rated values of the switching elements 13, 15. Within these restrictions the switching off speed is chosen that high that switching losses are reduced as much as possible.

Furthermore, the electric power converter 1 is divided into a primary side 25 and a secondary side 26 being decoupled galvanically from each other, which is represented by a dot dashed line in the figures. The primary side 25 may be considered as a low-voltage side of the electric power converter 1 and comprises the low-voltage input 8, the DC conversion unit 9 and the control unit 10. The secondary side 26 may be considered as a high-voltage side of the electric power converter 1 and comprises the DC link 2, the AC output 4 and the power unit 7. The driver units 11 are an interface between the primary side 25 and the secondary side 26.

Figure 2:
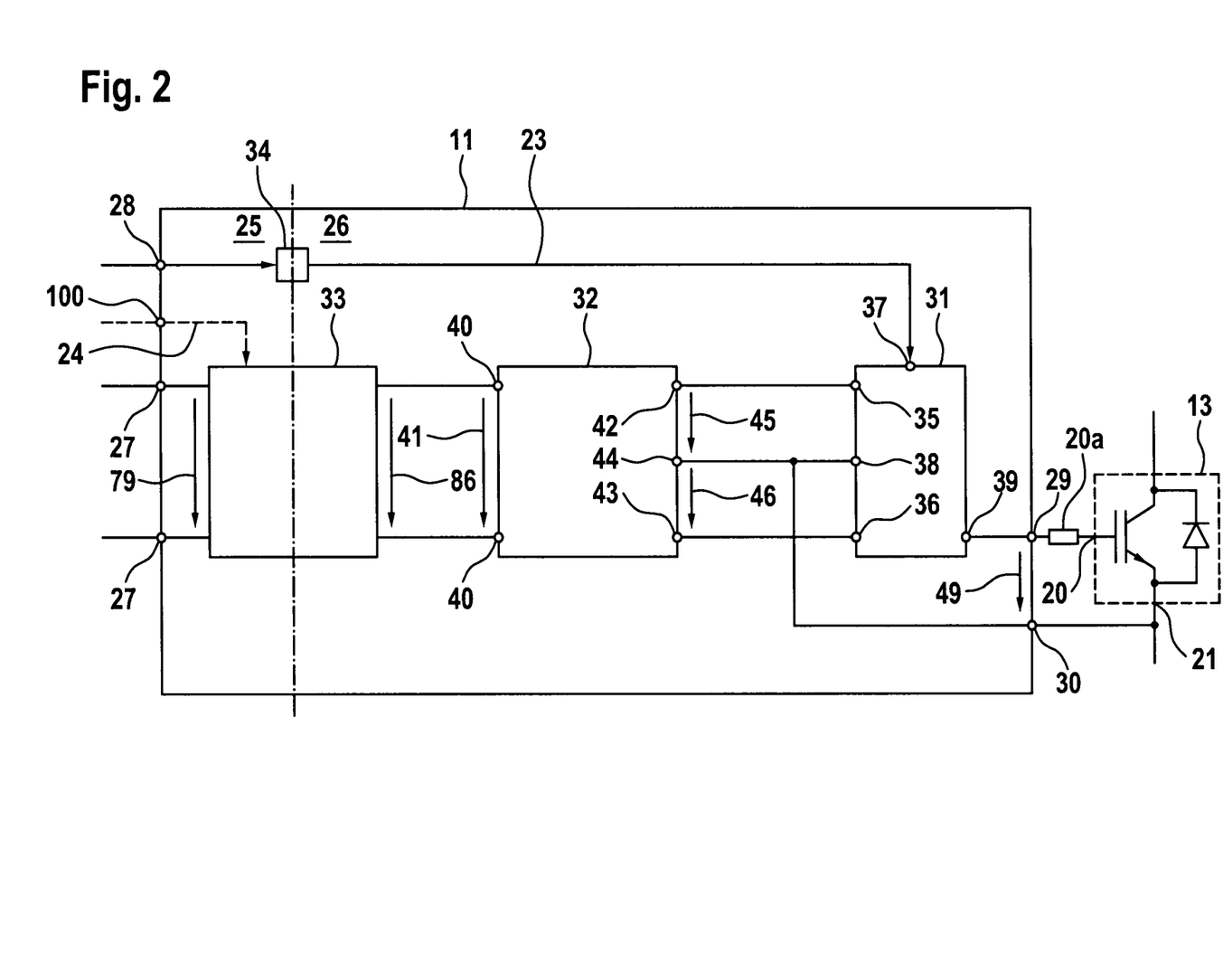
FIG. 2 is a block diagram of a driver unit of the electric power converter depicted in FIG. 1.

FIG. 2 is a block diagram of the driver unit 11 being representative for any driver unit 11 connected to one of the switching elements 13, 15 of a respective half bridge 12. In the following the driver unit 11 connected to the switching element 13 is described in detail, wherein all statements refer analogously to driver units 11 connected to the other switching elements 13, 15.

The driver unit 11 comprises a first input terminal 27 for obtaining the supply voltage from the DC conversion unit 9 and a second input terminal 28 for obtaining the control signal 23 from the control unit 10. Furthermore, the driver unit 11 comprises a first output terminal 29 for connecting the control terminal 20 of the switching element 13 via a series resistor 20a. Moreover, the driver unit 11 comprises a second output terminal 30 for connecting the further terminal 21 of the switching element 13. Besides, the driver unit 11 comprises an output stage section 31, a first DC conversion section 32, a second DC conversion section 33 and an insulation element 34.

The output stage section 31 comprises a high-side terminal 35, a low-side terminal 36 and a third input terminal 37 for obtaining the control signal 23, a fourth input terminal 38 and an output terminal 39 connected to the first output terminal 29 of the driver unit 11. The output stage section 31 is controllable based on the control signal 23 to connect either the high-side terminal 35 or the low-side terminal 36 to the output terminal 39 being connected to the first output terminal 29 of the driver unit 11. Therein, when the control signal 23 is indicative for switching on the switching element 13, the high-side terminal 35 is connected to the output terminal 39 and, when the control signal 23 is indicative for switching off the switching element 13, the low-side terminal 36 is connected to the output terminal 39.

The first DC conversion section 32 comprises an input terminal 40, over which an input voltage 41 drops, a first output terminal 42 connected to the high-side terminal 35, a second output terminal 43 connected to the low-side terminal 36 and a third output terminal 44 connected to the second output terminal 30 of the driver unit 11. The first DC conversion section 32 is configured to supply the output stage section 31. Therein, the first DC conversion section 32 converts the input voltage 41 into a positive first voltage 45 between the high-side terminal 35 and the second output terminal 30. Thus, the first voltage 45 is provided between the first output terminal 42 and the third output terminal 44. Furthermore, the first DC conversion section 32 converts the input voltage 41 into a positive second voltage 46 between the second output terminal 30 of the driver unit 11 and the low-side terminal 36. Thus, the second voltage 46 is provided between the third output terminal 44 and the second output 43.

Consequently, when the control signal 23 is indicative for switching on the switching element 13, the positive first voltage 45 is used for switching on the switching element 13. When the control signal 23 is indicative for switching off the switching element 13, the inverted second voltage 46, thus negative voltage, is used for switching off the switching element 13.

The first DC conversion section 32 is configured to provide the first voltage 45 and the second voltage 46 such that, when the value of the first voltage 45 is above a threshold value, to which the first voltage 45 is limited, the value of the second voltage 46 increases with an increase of the input voltage 41. Therein, in a normal operation of the driver unit 11 the value of the input voltage 45 is equal or higher than the threshold value. Thus, when the input voltage 41 is equal to the threshold value, the first voltage 45 corresponds substantially to the input voltage 41 and the second voltage 46 is substantially zero. Upon increasing the input voltage 41, the first voltage 45 remains substantially constant and the second voltage 46 increases, which results in a more negative voltage for switching off the switching element 13. Thus, by varying the input voltage 41 above the threshold value, the switching off speed of the switching element 13 is varied as a high negative voltage discharges a capacity of the control terminal 20, i.e. a gate capacity of the power transistor 18, faster than a lower negative voltage.

Figure 3A:
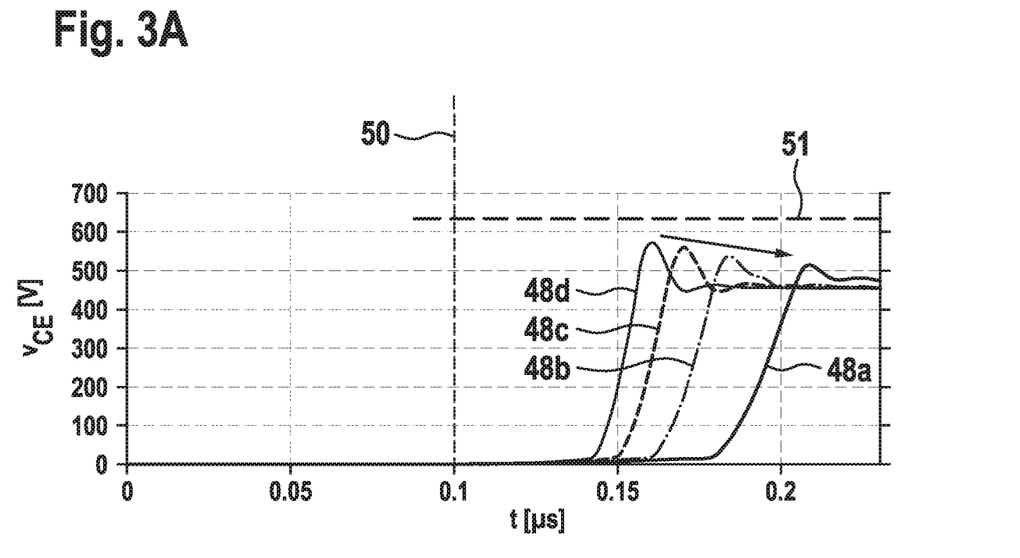
FIGS. 3A and 3B are diagrams of voltages across a switching path of the switching element over time.
Figure 3B:
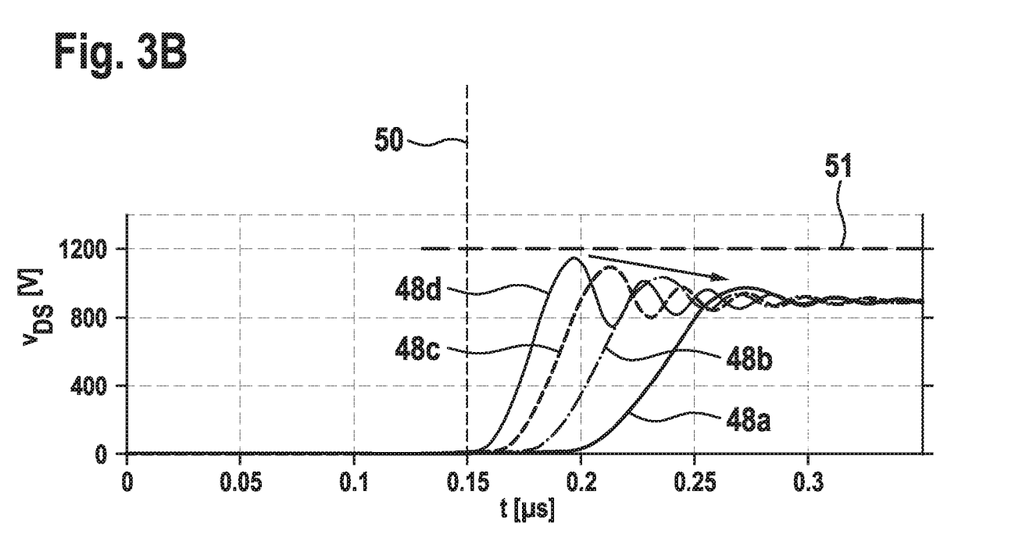

FIGS. 3A and 3B are diagrams of voltages 48a, 48, 48c, 48d over the switching path of the switching elements 13 over time t. FIG. 3A refers to the switching element 13 being an insulated gate bipolar transistor, so that the voltages 48a, 48b, 48c, 48d are collector-emitter-voltages ($v_{CE}$). On the contrary, FIG. 3B refers to the switching element 13 being an insulated gate field-effect transistor, so that the voltages 48a, 48b, 48c, 48d are drain-source-voltages ($v_{DS}$). Therein, a respective voltage 48a refers to a second voltage 46 of 0 V, a respective voltage 48b refers to a second voltage 46 of 5 V, a respective voltage 48c to a second voltage 46 of 10 V and a respective voltage 48d to a second voltage 46 of 15 V for an exemplary configuration.

As can be seen by increasing the second voltage 46 corresponding to a decrease of a voltage 49 between the first output terminal 29 and the second output terminal 30 the voltages 48a, 48b, 48c, 48d raise earlier on the cost of a higher voltage overshoot. Thus, by varying the input voltage 41 above the threshold voltage, the switching off speed of the switching element 13 is varied as a high negative voltage discharges a capacity of the controller terminal 12, i.e. a gate capacity of the power transistor 18, faster than a lower negative voltage. Note that the maximum value of the voltages 48a to 48d is limited to a maximum rated blocking voltage 51.

Figure 4:
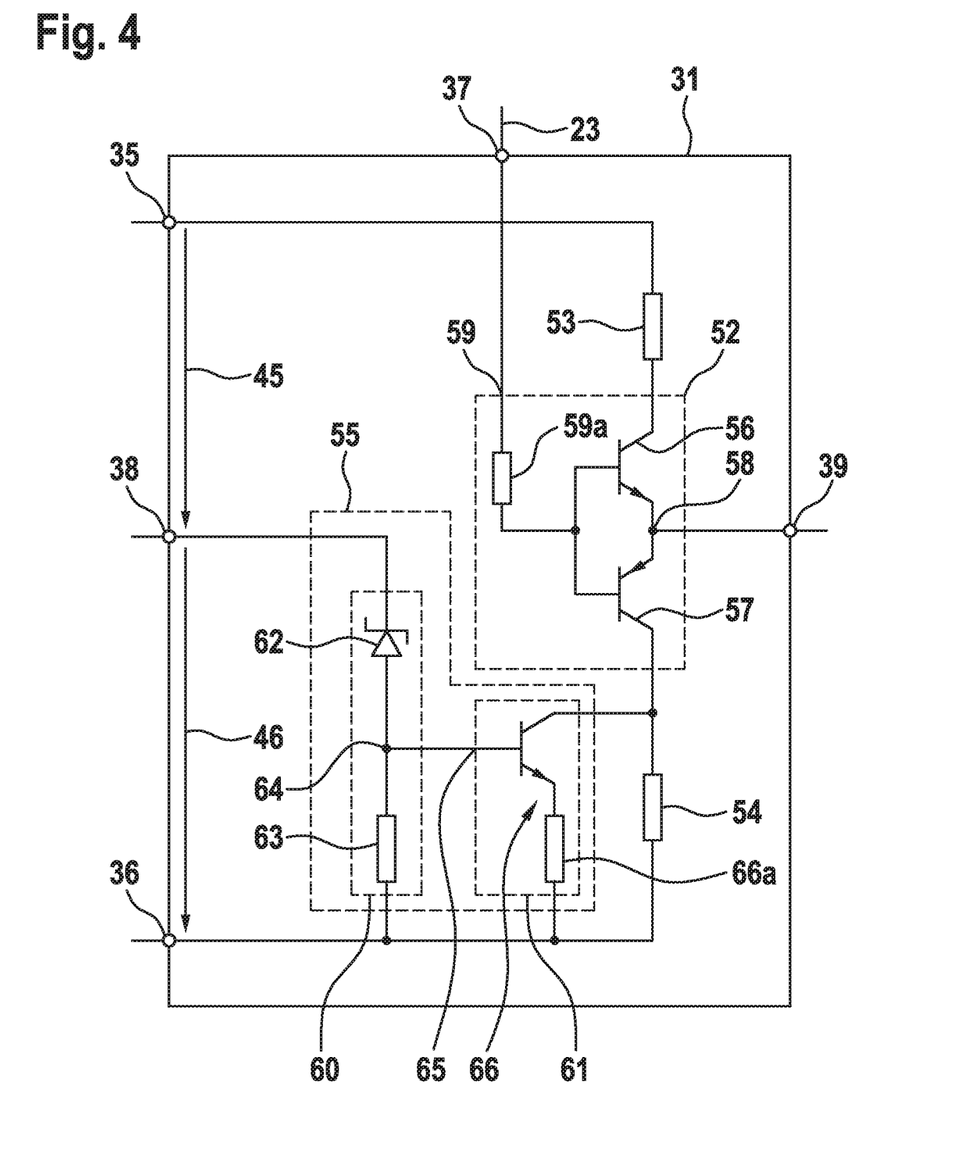
FIG. 4 is a schematic diagram of an output stage section of the driver unit depicted in FIG. 2.

FIG. 4 is a schematic diagram of the output stage section 31. The output stage section 31 comprises a push-pull-subsection 52, two resistors 53, 54 and an active subsection 55.

The push-pull-subsection 52 comprises a controllable high-side switch 56 and a controllable low-side switch 57 being realized by two transistors of different types. Therein, the high-side switch 56 is realized by an npn-transistor and the low-side switch 57 is realized by a pnp-transistor. Alternatively, the low-side switch 56 is realized by an n-channel transistor and the high-side switch 57 is realized by a p-channel transistor. A central tap 58 between the switches 56, 57 is connected to the output terminal 39 of the output stage section 31. The resistor 53 is connected between the high-side terminal 35 and the high-side switch 56 of the push-pull-subsection 52, whereas the resistor 54 is connected between the low-side terminal 36 and the low-side switch 57. The push-pull-subsection 52 comprises a control terminal 59 connected to a respective control terminal of the switches 56, 57 via a series resistor 59a.

Upon receiving the control signal 23 being indicative for switching on the switching element 13 via the third input terminal 37 at the control terminal 59 of the push-pull-subsection 52 the high-side switch 56 closes and the low-side switch 57 opens. Then the first voltage 45 drops between the resistor 53, the first output terminal 29 and the second output terminal 30, therein charging the capacity of the control terminal 20 of the switching element 13 with a positive voltage. Upon receiving the control signal 23 being indicative for switching off the switching element 13 at the control terminal 59 the low-side switch 57 closes and the high-side switch 56 opens. Then the second voltage 46 drops between the second output terminal 30, the first output terminal 29 and the resistor 54, therein discharging the capacity of the control terminal 20 of the switching element 13 with a negative voltage.

The active subsection 55 is used optionally to increase the switching off speed with an increase of the second voltage 46. The active subsection 55 is connected in parallel to the resistor 54 between the first output terminal 39 and the low-side terminal 36 and is configured to sink a current increasing corresponding to an increase of the second voltage 46. The active subsection 55 comprises a reference value element 60 and an amplifier circuit 61, wherein the amplifier circuit 61 is configured to sink the current in addition to the current flowing through the resistor 54, when the value of second voltage exceeds a reference voltage provided by the reference value element 60. Therein, the amplifier circuit 61 switches a resistor 66a being part of the amplifier circuit in parallel to the resistor 54.

The reference value element 60 is connected between the fourth input terminal 38 being connected to the second output terminal 30 of the driver unit 11 and the low-side terminal 36. The reference value element 60 comprises a Zener diode 62 and a resistor 63 connected in series, wherein central tap 64 therebetween is connected to an input 65 of the amplifier circuit 61. The amplifier circuit 61 may be realized by a transistor circuit 66 or an operational amplifier circuit, alternatively.

The Zener voltage of the Zener diode 62 defines the reference voltage, which is chosen below the absolute value of a maximum rated negative voltage between the control terminal 20 and the further terminal 21 of the switching element 13. Thus, if the discharging current flowing through the resistor 54 does not result in the desired switching off speed, the switching off speed can be increased by the active subsection 55. Therein, the reference voltage is chosen such that at the maximum rated negative voltage the desired current being the sum of the current flowing through the resistor 54 and through the amplifier circuit 61 is achieved.

Figure 5:
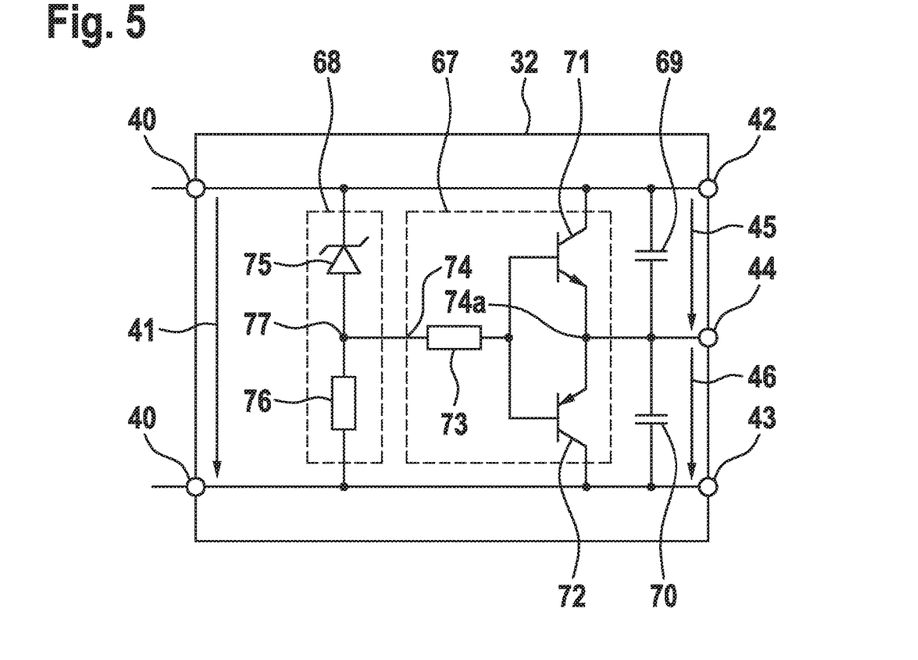
FIG. 5 is a schematic diagram of a first DC conversion section of the driver unit depicted in FIG. 2.

FIG. 5 is a schematic diagram of the first DC conversion section 32. The first DC conversion section 32 comprises a push-pull-subsection 67, a reference value subsection 68 and two buffer capacitors 69, 70.

The push-pull-subsection 67 comprises a high-side transistor 71, a low-side transistor 72 and a series resistor 73 connected between a control terminal 74 of the push-pull-subsection and a respective control terminal of the transistors 71, 72. The transistors 71, 72 are arranged between both potentials of the input voltage 41. A central tap 74a between the transistors 71, 72 is connected to the third output terminal 44 and via that to the second output terminal 30 of the driver unit 11 and the fourth input terminal 38 of the output stage section 31.

The reference value subsection 68 comprises a Zener diode 75 and a resistor 76 connected in series. A central tap 77 therebetween is connected to the control terminal 74 of the push-pull-subsection 67. By means of the Zener diode 75 the threshold is defined.

Upon a variation of the input voltage 41 being above the threshold a voltage drop over the Zener diode 75 remains substantially constant, whereas a voltage drop over the resistor 76 increases. Thus, the voltage drop over the low-side transistor 72 increases, which provides the variable second voltage 46, whereas a voltage drop over the transistor 71, which corresponds to the first voltage 45 remains substantially constant. The buffer capacitor 69 connected between the first output terminal 42 and the third output terminal 45 buffers the first voltage 45. The buffer capacitor 70 connected between the thought output terminal 44 and the second output terminal 43 buffers the second voltage.

In sum, the first DC conversion section 32 defines a reference potential at the third output terminal 44 for the further terminal 21 of the switching element 13 and provides in the normal operation, in which the first voltage 41 is above the threshold defined by the reference value subsection 68, the substantially constant first voltage 45 for switching on the switching element 13 and the variable second voltage 46 for switching off the switching element 13. Therein, the sum of the first voltage 45 and the second voltage 46 is equal to the input voltage 41. Thus, varying the input voltage 41 allows a corresponding variation of the switching off speed of the switching element 13.

Figure 6:
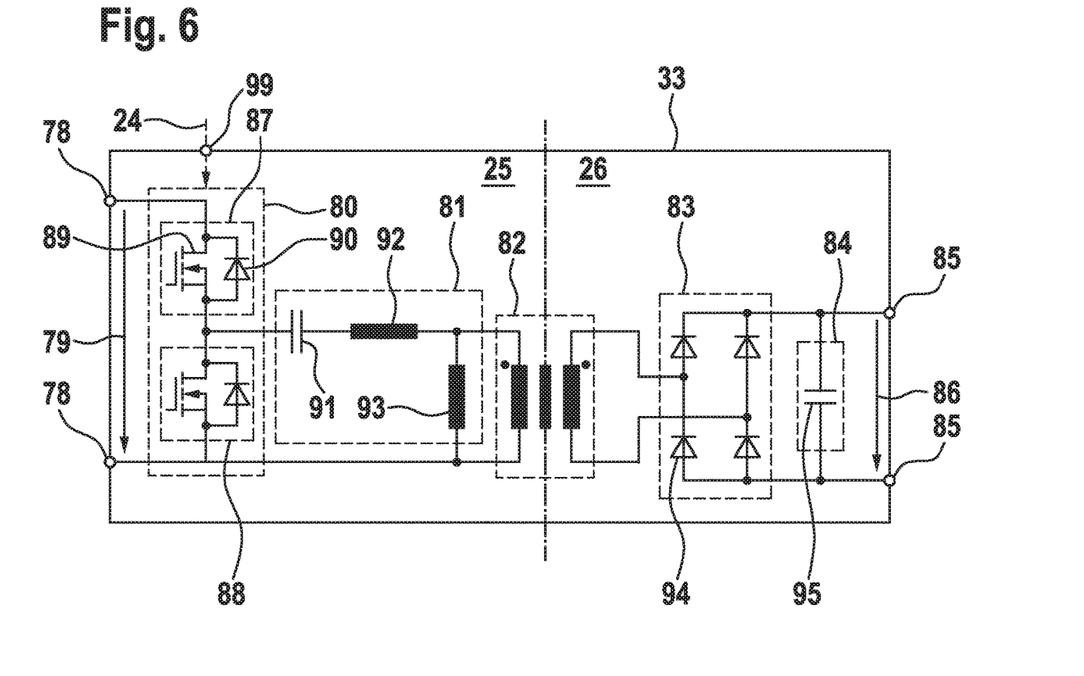
FIG. 6 is a schematic diagram of a second DC conversion section of the driver unit depicted in FIG. 2.

FIG. 6 is a schematic diagram of the second DC conversion section 33, which is realized by a resonant converter, here by an LLC converter.

The second DC conversion section 33 comprises an input terminal 78, which obtains the supply voltage provided by conversion unit 9 as an input voltage 79 of the second DC conversion section 33 via the first input terminal 27. Furthermore, the second DC conversion section 33 comprises a switching subsection 80, a resonant circuit subsection 81, a transformer subsection 82, a rectifier subsection 83, a smoothing subsection 84 and an output terminal 85, at which an output voltage 86 being the input voltage 41 of the first DC conversion 32 is provided.

The switching subsection 80 comprises a high-side switch 87 and a low-side switch 88, which each comprise a transistor 89 and a diode 90 connected in parallel. Again, the transistor 89 may be an insulated gate bipolar transistor or an insulated gate field-effect transistor, wherein the last case the diode 90 is realized by the body diode of the transistor 89. By means of the switching subsection 80, the input voltage 79 is switched into an AC voltage for the further conversion by the resonant converter.

The resonant circuit subsection 81 defines a resonance frequency of the resonant converter and is connected in parallel to the low-side switch 88 and to the transformer subsection 82. The resonant circuit subsection 81 comprises a capacitor 91 and a coil 92 connected in series and a magnetization inductance 93 in parallel to the transformer subsection 82. The coil 92 and the magnetization inductance 93 may by omitted so that the resonance frequency is defined by the capacitor 91 and an inductance of the transformer subsection 82. Alternatively, the resonant circuit subsection 81 may be of higher order, therein defining a plurality of resonant frequencies.

The transformer subsection 82 decouples galvanically the first input terminal 27 on the one hand and the output terminals 29, 30, the output stage section 31 and the first DC conversion section 32 on the other hand. Thus, the primary side 25 and the secondary side 26 are considered as respective sides of the driver unit 11, the second DC conversion section 33 and the transformer section 82 as well. The galvanic decoupling is completed by the insulation element 34 (see FIG. 2) with respect to the control signal 23.

The transformer subsection 82 transforms a voltage on the primary side 25 of the transformer subsection 82 into a voltage on the secondary 26 side of the transformer subsection 82, which is rectified to the DC output voltage 86 by means of the rectifier subsection 83, being a full bridge rectifier formed by four diodes 94, and smoothed by the smoothing subsection 84, comprising a capacitor 95. Note that the a full bridge rectifier is described here exemplarily and that the rectifier subsection 83 may alternatively comprise a center tap topology, a voltage doubler topology or another commonly known topology.

Figure 7:
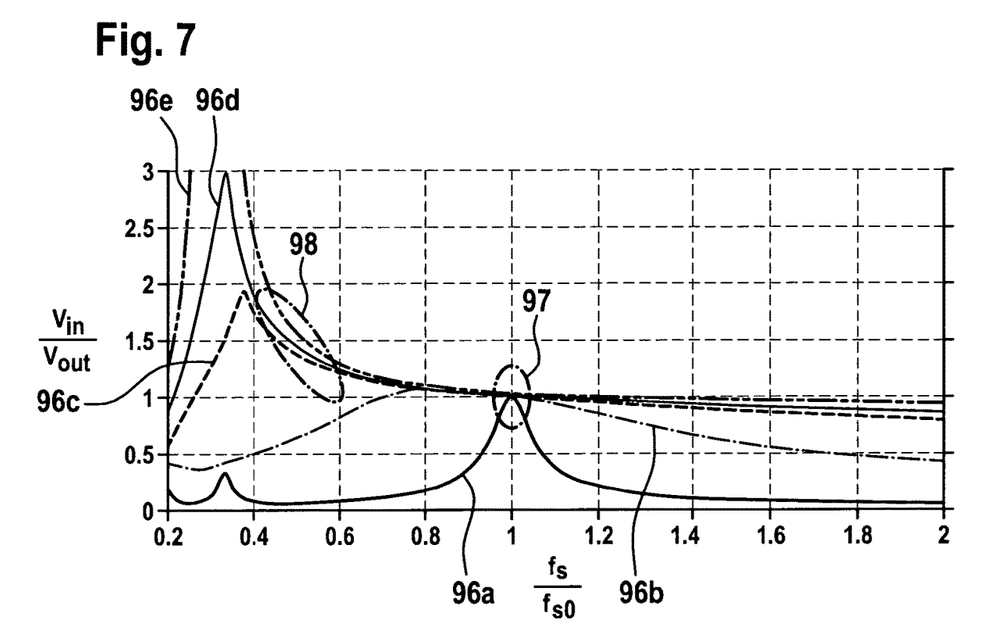
FIG. 7 is a diagram of output voltage conversion ratios of the second DC conversion section depicted in FIG. 6 over a normalized switching frequency.

FIG. 7 is a diagram of output voltage conversion ratios ($V_{out}/V_{in}$) 96a, 96b, 96c, 96d, 96e over a normalized switching frequency ($f_s/f_{s0}$). Therein, the output voltage conversion ratio refers to the ratio of the output voltage 86 to the input voltage 79 and the normalized switching frequency to the ratio of a switching frequency of the switching subsection 80 to the resonance frequency of the series resonant circuit formed by the capacitor 91 and the coil 92. The voltage conversion ratios 96a to 96e refer to different normalized loads $Q_L$ being the ratio of an ohmic load of the resonant converter to a significant impedance $$Z = \sqrt{\frac{L}{C}}$$

wherein L denotes the inductance of the coil 92 and C denotes the capacitance of the capacitor 91. Therein, the ratio 96a refers to $Q_L=0.1$, the ratio 96b refers to $Q_L=1$, the ratio 96c refers to $Q_L=5$, the ratio 96d refers to $Q_L=10$ and the ratio 96e refers to $Q_L$ converging toward infinity.

As can be seen from FIG. 7, by controlling the switching subsection 80 to switch within an interval near $f_s/f_{s0}=1$ the output voltage conversion ratios 96a to 96e are substantially independent of the load. An operating area around a load-independent operating point is marked with reference sign 97. Thus, the driver unit 11 is configured to control the switching subsection 18 to operate within an interval of e.g. 0.95 to 1.05 of the normalized switching frequency, preferably with a switching frequency substantially equal to the resonant frequency.

Therein, the input voltage 79 is galvanically decoupled from the output voltage 86, which is a potential-free voltage being the input voltage 41 of the first DC conversion section 32. The switching off speed of the switching element 13 is controlled by the input voltage 79, which is provided by the DC conversion unit 9 of the electric power converter 1. Consequently, the variation of the switching off speed is based on the control information 24 determined by the control unit 10 of the electric power converter 1 and provided to the DC conversion unit 9. Based on the control information 24 the DC conversion unit 9 varies the supply voltage, which is the input voltage 79 of the second DC conversion section 33.

According to a further embodiment corresponding to the first embodiment, the electric power converter 1 is not divided into the primary side 25 and the secondary side 26, wherein the second DC conversion section 33 is omitted and the input voltage 41 for the first DC conversion section is obtained directly at the first input terminal 27 of the driver unit 11.

According to a further embodiment corresponding to the first embodiment of the electric power converter 1, the control information 24 is provided to the second DC conversion section 33 instead of being provided to the DC conversion unit 9, which is illustrated by dashed lines in FIGS. 1, 2 and 6.

Therein, by means of the control information 24 the switching frequency of the switching subsection 80 is varied below the resonance frequency within a load-dependent operating area marked with reference sign 98 in FIG. 7. As can be seen in this operating area the output voltage conversion ratio highly depends on the switching frequency within an interval of the normalized switching frequency limited by $f_s/f_{s0}=0.4$ and $f_s/f_{s0}=0.6$. Thus, according to the present embodiment a constant input voltage 79 is provided to the second DC conversion section and the output voltage 86 is varied by varying the switching frequency, which allows a corresponding variation of the switching off speed of the switching element 13. Within the operating area 98 the output voltage ratio depends on the load of the second DC conversion section 33. Accordingly, the control unit 10 is configured to determine the control information 24 based on the load of the second DC conversion 33 section, additionally.

For obtaining the control information 24 the second DC conversion section 33 comprises a further input terminal 99 (see FIG. 6) connected to the switching subsection 80 and the driver unit 11 comprises a further input terminal 100 (see FIG. 2) connected to the second DC conversion section 33. Note that the control information 24 is obtained on the primary side 25 of the driver unit 11, therein avoiding a transmission of the control information 24 to the secondary side 26. Thus, an insulation element for transmitting the control information 24 is not required.

According to a further embodiment of the electric power converter 1 corresponding to the aforementioned one, the DC conversion unit 9 is omitted and the driver unit 11 are directly supplied by the voltage provided to the low-voltage terminal 8.

According to a further embodiment corresponding to the aforementioned ones, the electric power converter 1 is a DC/DC converter, e.g. comprising a boost converter, a buck converter, a combined boost-buck-converter, a flyback converter, a phase-shifted full-bridge, a capacitive half bridge or another hard-switched half bridge. Therein, one or more switching elements of the DC/DC converter are connected to the driver unit 11 and the control unit 10 is configured to control the switching element such that the DC voltage provided to the DC link 2 is converted into a DC voltage by means of an additional inductance element.

According to a further embodiment, the electric power converter 1 is a controlled AC/DC converter such as a charging device for a battery. Therein, one or more switching elements of the AC/DC converter are connected to the driver unit 11 and the control unit 10 is configured to control the switching elements such that a AC voltage is rectified into a DC voltage.

Figure 8:
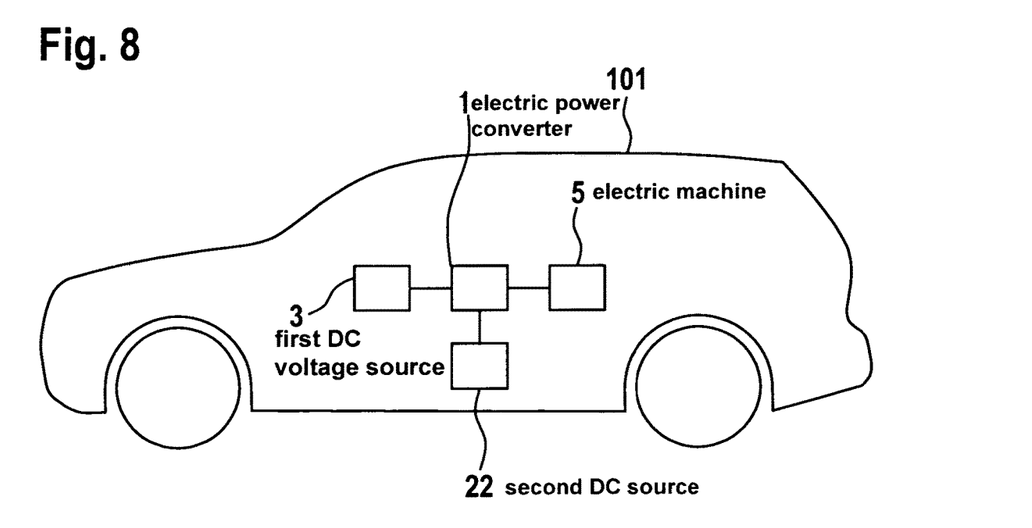
FIG. 8 is a block diagram of an embodiment of a vehicle.

FIG. 8 is a block diagram of an embodiment of a vehicle 101 comprising an electric machine 5 for driving the vehicle, a high-voltage battery 3 and a low-voltage battery 22 and an electric power converter 1. Therein, the electric power converter 1 is configured to convert a DC voltage provided by the high-voltage battery 3 into an AC current supplying the electric machine 5, wherein the low-voltage battery 22 provides a supply voltage to the electric power converter 1. Aside, the vehicle 101 comprises an electric power converter 1 being a DC/DC converter for a wiring system (not shown) of the vehicle 101. Furthermore, the vehicle 101 comprises an electric power converter 1 being a AC/DC converter configured as an onboard charger for charging the high-voltage battery 3 by an AC voltage provided by a power grid.

The invention claimed is:

1. Driver unit for a voltage-controlled switching element, comprising
   a first output terminal for connecting a control terminal of the switching element,
   a second output terminal for connecting a further terminal of the switching element,
   an output stage section having a high-side terminal and a low-side terminal and being controllable to connect one of its terminals to the first output terminal of the driver unit based on a control signal which turns the switching element ON/OFF, and
   a DC conversion section configured to supply the output stage section and to convert an input voltage into a positive first voltage between the high-side terminal and the second output terminal of the driver unit and into a positive second voltage between the second output terminal of the driver unit and the low-side terminal,
   wherein the DC conversion section is configured to provide the first voltage and the second voltage such that, when a value of the first voltage is above a threshold value, a value of the second voltage increases more than the first voltage with an increase of the input voltage.

2. Driver unit according to claim 1, wherein the threshold value is a value, to which the first voltage is limited by the DC conversion section.

3. Driver unit according to claim 1, wherein the DC conversion section comprises a push-pull-subsection having a central tap connected to the second output terminal of the driver unit.

4. Driver unit according to claim 3, wherein the DC conversion section comprises a reference value subsection configured to define the threshold value and connected between a positive potential of the input voltage and a control terminal of the push-pull-subsection.

5. Driver unit according to claim 1, wherein the output stage section comprises a push-pull-subsection having a central tap connected to the first output terminal of the driver unit and/or having a control terminal for obtaining the control signal.

6. Driver unit according to claim 1, wherein the output stage section comprises an active subsection interconnected between the first output terminal of the driver unit and the low-side terminal and configured to sink a current flowing to the low-side terminal increasing corresponding to an increase of the second voltage.

7. Driver unit according to claim 6, wherein the active subsection comprises a reference value element and an amplifier circuit, wherein the amplifier circuit is configured to sink the current, when the value of second voltage exceeds a reference voltage provided by the reference value element.

8. Driver unit according to claim 1, wherein the driver unit is divided into a primary side and a secondary side being decoupled galvanically form each other, wherein the DC conversion section, the output stage section and the output terminals of the driver unit are part of the secondary side, and a first input terminal of the driver unit for providing a supply voltage for the driver unit, a second input terminal of the driver unit for obtaining the control signal and a third input terminal of the driver unit for obtaining a control information representative for a switching off speed of the switching element are part of the primary side.

9. Driver unit according to claim 1, wherein the driver unit comprises a second DC conversion section configured to convert an input voltage into an output voltage provided to the first DC conversion section as its input voltage.

10. Driver unit according to claim 8, wherein the first input terminal on the one hand and the first DC conversion section, the output stage section and the output terminals of the driver unit on the other hand are galvanically decoupled by the second DC conversion section.

11. Driver unit according to claim 9, wherein the second DC conversion section comprises a resonant converter or an LLC-converter.

12. Driver unit according to claim 11, wherein a switching subsection of the resonant converter is controlled with a switching frequency within an interval enclosing a resonance frequency of the resonant converter or to control a switching subsection of the resonant converter with a switching frequency being below a resonance frequency of the resonant converter based on the or a control information representative for a switching off speed of the switching element.

13. Electric power converter comprising a switching element having a control terminal, and the driver unit according to claim 1, wherein the first output terminal of the driver unit is connected to the control terminal of the switching element.

14. Vehicle, comprising the electric power converter according to claim 13, and an electric machine supplied by the electric power converter.

15. Method for operating an electric power converter having a voltage-controlled switching element and a driver unit, comprising:

preparing the driver unit which comprises a first output terminal connected to a control terminal of the switching element, a second output terminal connected to a further terminal of the switching element, an output stage section having a high-side terminal and a low-side terminal and being controlled to connect one of its terminals to the first output terminal of the driver unit based on a control signal representative switching the switching element, and a DC conversion section, and converting, in the DC conversion section, an input voltage into a positive first voltage between the high-side terminal and the second output terminal of the driver unit and into a positive second voltage between the second output terminal of the driver unit and the low-side terminal, and suppling to the output stage section, wherein the DC conversion section provides the first voltage and the second voltage such that, when a value of the first voltage is above a threshold value, a value of the second voltage increases more than the first voltage with an increase of the input voltage.

* * * * *